United States Patent [19]

Bittle et al.

[11] Patent Number: 4,769,777

[45] Date of Patent: Sep. 6, 1988

[54] UNPREDICTABLE BIT STREAM GENERATOR

[75] Inventors: William D. Bittle; Ellwood P. McGrogan, both of Camden County; Moishe Kleidermacher, Burlington County, all of N.J.; Paul M. Yun, Philadelphia, Pa.

[73] Assignee: General Electric Company, Camden, N.J.

[21] Appl. No.: 878,254

[22] Filed: Jun. 25, 1986

[51] Int. Cl.$^4$ ............................................. G06F 1/02
[52] U.S. Cl. .................................................. 364/717
[58] Field of Search .................... 364/717, 410, 412

[56] References Cited

U.S. PATENT DOCUMENTS

| | | | |
|---|---|---|---|
| 3,614,400 | 10/1971 | Farnett et al. | 364/717 |
| 3,986,168 | 10/1976 | Anderson | 340/146.1 A X |
| 4,318,008 | 3/1982 | Nall | 307/84 |
| 4,365,145 | 12/1982 | Frentress | 364/717 |
| 4,396,894 | 8/1983 | Willmore | 331/78 |
| 4,450,321 | 5/1984 | Quigley et al. | 364/717 |
| 4,694,412 | 9/1987 | Domenik et al. | 364/717 |

Primary Examiner—Gary V. Harkcom
Assistant Examiner—Long Thanh Nguyen
Attorney, Agent, or Firm—Clement A. Berard, Jr.; William H. Meise

[57] ABSTRACT

An apparatus for breaking the periodicity of the pseudorandom bit stream output from a linear sequence generator. The apparatus includes a ring oscillator which periodically corrupts the sequence of the generator. The level of the supply voltage applied to the logic elements of the ring oscillator is varied over time, thereby altering the oscillator output frequency. In a second embodiment, the temperature of the logic elements of the ring oscillator is varied over time, thereby also altering the oscillator output frequency. A system comprising four of the above-disclosed apparatus having different linear sequences and different corrupting influences, are multiplexed, wherein the multiplexing selection criterion is determined by a logical combination of the four linear sequences.

21 Claims, 5 Drawing Sheets

UNPREDICTABLE BIT STREAM GENERATOR

This invention relates generally to unpredictable bit stream generation and, more particularly, to an apparatus for time-varying the frequency of a ring oscillator to thereby break the periodicity of a digital sequence generator.

BACKGROUND OF THE INVENTION

Electronic random sequence generators have been in use since about the mid-1950's. The major applications have been in tactical communications as well as in guidance, anti-jamming and anti-interference systems. The two major categories of random sequence generators are analog circuits, including noise diodes, and digital circuits, including linear sequence generators.

In a typical analog random sequence generator, a thermal noise source, such as a temperature limited diode, produces a train of pulses in which the intervals between pulses follow a random distribution. The randomness of the occurrences of such a train of pulses may be employed in any one of a number of ways well known in the art to provide a random sequence of data. For the purposes stated, sequence generators using noise diodes provide the beneficial aspects of true randomness: non-repeatability and non-predictability. However, their disadvantages include their large size, the difficulty in screening noise diodes, their susceptibility to an RF environment and their difficulty in testing.

Digital random sequence generators typically employ linear sequence generators which consist essentially of a ring-connected shift register, in which the input signal to the device at any time is determined by the logical combination of the output signal and the signal present in one or more intermediate positions of the device. Appropriate choices of the stages and the logical operations will cause the device to generate a pulse sequence which repeats only after a known interval and has a random distribution over this interval. Because its pulse sequence is periodic, and therefore predictable, such a generator is referred to for convenience as a pseudorandom sequence generator.

It is the purpose of the present invention to provide an apparatus for generating an unpredictable stream of digital data. It is an object to extract the useful properties from linear sequence generators, while eliminating their undesirable properties. The useful properties of linear sequence generators include the mean, the variance and the distribution which satisfy statistical means of measurement for a test of randomness. The undesirable properties, periodicity and predictability, can be combined in one parameter, since periodicity is a necessary condition for predictability. Therefore, the undesirable properties of a linear sequence generator may be eliminated by breaking the periodicity.

SUMMARY OF THE INVENTION

In accordance with the principles of the present invention, there is disclosed an apparatus for generating an unpredictable stream of digital data. The apparatus comprises an oscillator including an odd-numbered plurality of digital logic inverter circuits coupled in series to form an endless loop. The oscillator provides an oscillating digital output signal having frequency determined by the number of inverter circuits and by the propagation delay times through the inverter circuits, the propagation delay times being affected by external influences on the inverter circuits. The apparatus also comprises a first sequence generator coupled to the oscillator for generating sequences of digital data, the sequences being corrupted by variations in the oscillator output signals. The apparatus further comprises means for time-variably altering the frequency of the oscillator.

DETAILED DESCRIPTION OF THE PREFERRED EMBODIMENTS

Figure 1:
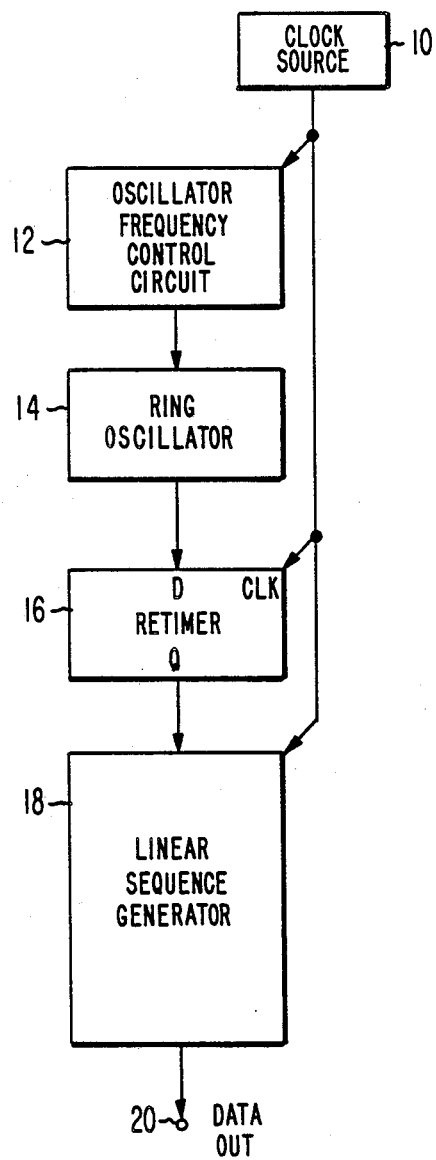
FIG. 1 is a block diagram of an unpredictable bit stream generator according to the present invention.

Referring to FIG. 1, there is shown in block diagram representation, an unpredictable bit stream generator according to the present invention. The generator of FIG. 1 includes a linear sequence generator 18 which, by and of itself, may comprise an entirely adequate pseudorandom bit stream generator. A typical linear sequence generator, which may be of the type shown in FIG. 1 as generator 18, is shown in greater detail in FIG. 2 and is described in the accompanying text. As was noted earlier, generator 18 provides at output terminal 20 a stream of digital data which has the quality of pseudorandomness, but which is periodic and therefore predictable.

Figure 3:
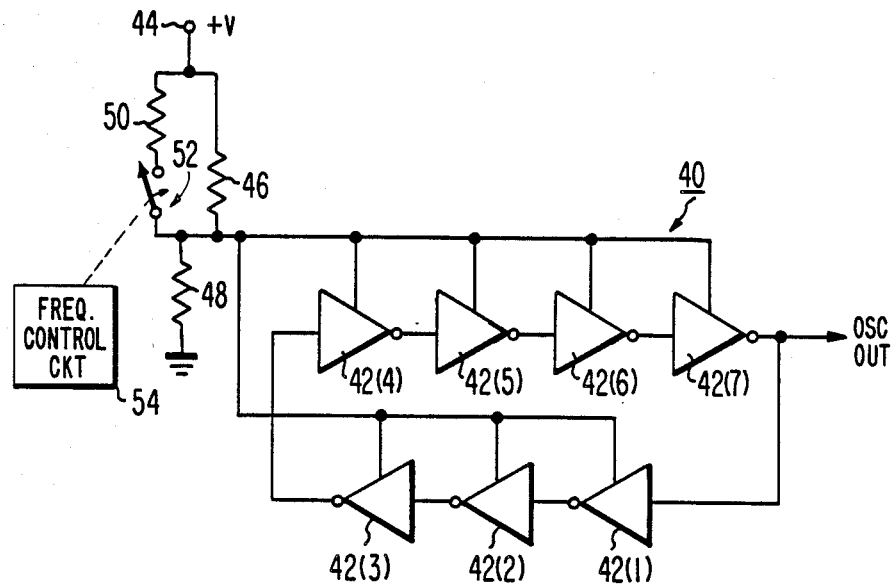
FIG. 3 illustrates a first embodiment of a ring oscillator for use in the generator of FIG. 1.
Figure 4:
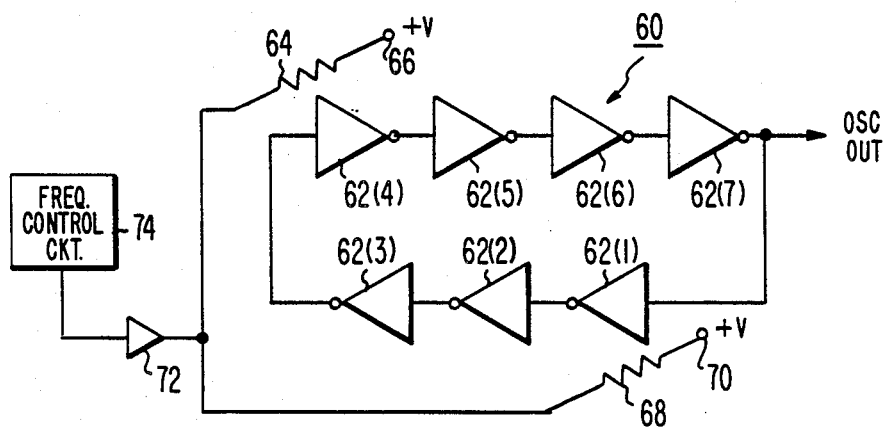
FIG. 4 illustrates a second embodiment of a ring oscillator for use in the generator of FIG. 1.

In order to break the periodicity of generator 18, ring oscillator 14, oscillator frequency control circuit 12 and retimer 16 combine to provide an input signal to generator 18 which thereby corrupts its output sequences. Ring oscillator 14 typically comprises an odd-numbered plurality of digital logic inverters coupled in series to form an endless ring. First and second embodiments of ring oscillator 14 are shown in FIGS. 3 and 4, respectively, and are described in the accompanying text.

Retimer 16 is shown in FIG. 1 as a D-type flip-flop, receiving the output signal from oscillator 14 at its data (D) input terminal and a clocking signal from clock source 10 at its clock (CLK) input terminal. In the present example, the frequency of the clock signal from source 10 may typically be 500 KHz, and the output signal frequency of ring oscillator 14 may typically be between about 2 and 10 MHz. Thus, retimer 16 periodically samples the asynchronous digital logic state of the output signal of ring oscillator 14, and applies the samples as inputs to linear sequence generator 18.

Figure 5:
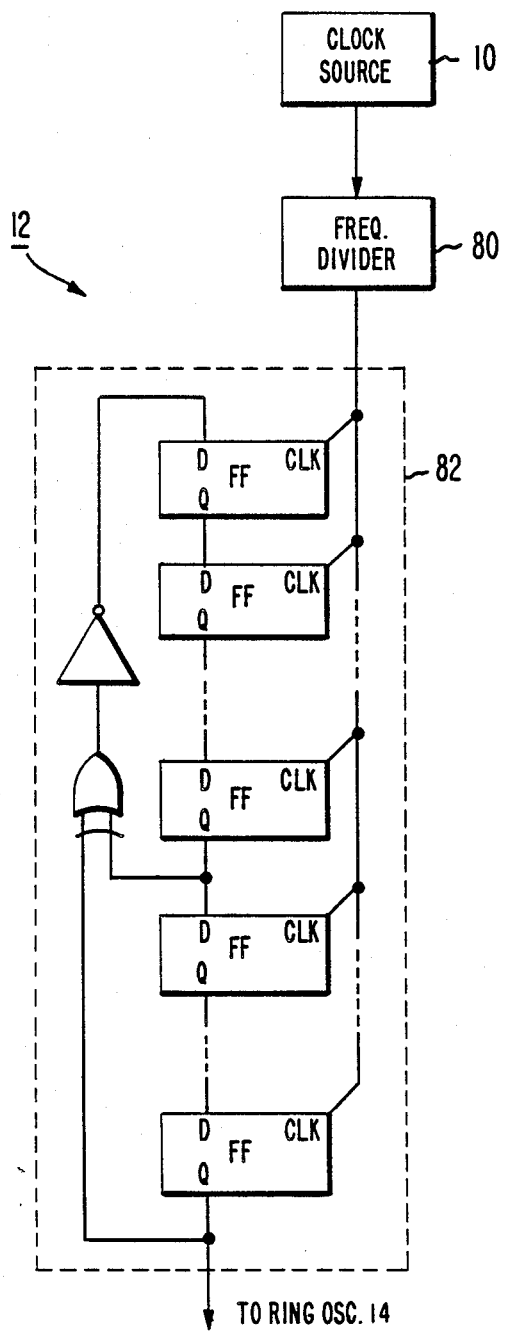
FIG. 5 is a detailed logic diagram of an oscillator frequency control circuit for use in the FIG. 1 embodiment.

The final element used to corrupt the output sequences of generator 18 is the oscillator frequency control circuit 12, part of which is shown in greater detail in FIG. 5. Control circuit 12 provides a time-varying influence over ring oscillator 14 to thereby affect its output signal frequency. In the first embodiment shown in FIG. 3, control circuit 12 time-varies the level of the supply voltage applied to the inverter circuits of oscillator 14; in the second embodiment shown in FIG. 4, control circuit 12 time-varies the ambient temperature in the proximity of the inverter circuits.

FIGS. 2 through 5 depict the present invention in greater structural detail than FIG. 1. They treat the heretofore mostly functional blocks as digital logic elements which are familiar to those skilled in the art. For example, the logic elements to be described may be found in, or easily incorporated from, the family of 74HC QMOS series digital logic circuits sold by RCA Solid State Division, Somerville, N.J. Other than speed, no special features or performance characteristics, attributable to a particular logic family, should be inferred from the designation of the digital family above; the distinctive shape or the caption within each block is sufficient to describe its logical function. Finally, the designation of a family of discrete logic circuits is not meant to exclude the integration of the entire present invention on a single substrate using well-known large scale integration (LSI) techniques.

Figure 2:
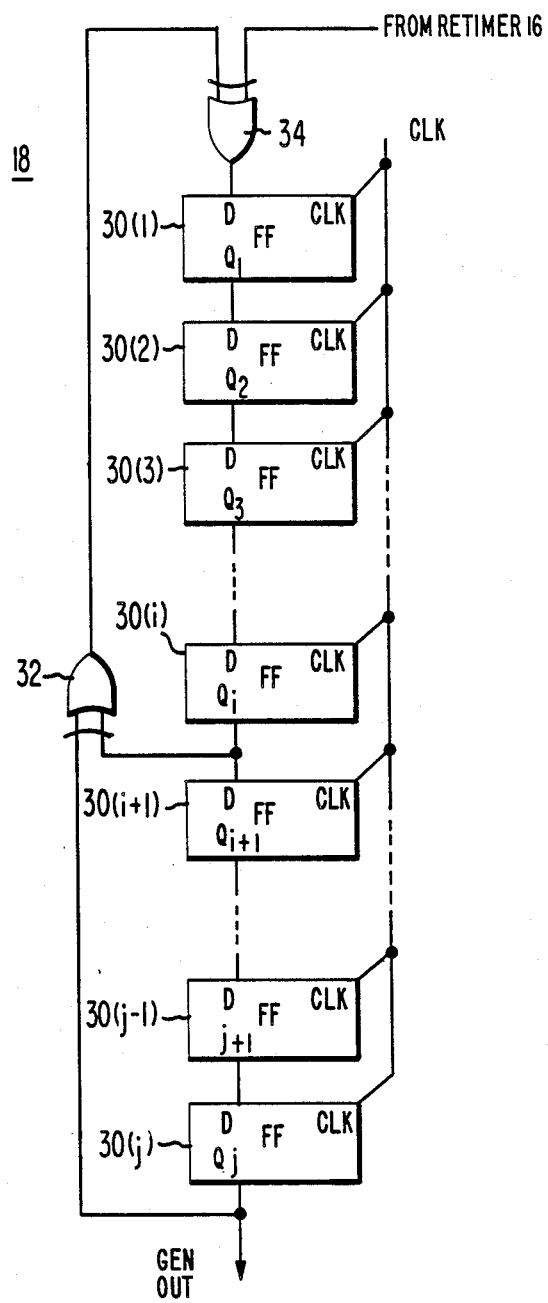
FIG. 2 is a detailed block diagram of a linear sequence generator for use in the FIG. 1 embodiment.

Referring to FIG. 2, there is shown a typical linear shift generator 18 which may be of the type described for use as generator 18 of FIG. 1. The FIG. 2 generator includes a plurality of D-type flip-flops 30(1), 30(2), ..., referred to collectively as flip-flops 30, configured as a shift register. That is, the output terminal of each flip-flop 30 is coupled to the D input of the succeeding stage, and all flip-flops 30 are clocked by a common clocking signal. The input signal provided to the first stage 30(1) is a logical combination of the last stage output, $Q_j$, and the output signal from at least one other stage. In the illustrated example, $Q_j$ is exclusive-ORed with the output from stage 30(i), $Q_i$, via gate 32. The output signal from gate 32 is exclusive-ORed with a sequence corrupting signal from retimer 16 (shown in FIG. 1) via gate 34, the output signal from which is coupled to the D input terminal of the first stage flip-flop 30(1) of linear sequence generator 18. The output signal of generator 18 may be chosen as the output from any of the stages 30. Linear sequence generators of the type shown in FIG. 2 are well known in the art and are described in U.S. Pat. No. 3,986,168, issued Oct. 12, 1976, to A. T. Anderson, for use in a digital error signal generator.

Referring now to FIG. 3, there is shown a ring oscillator 40 according to a first embodiment of the present invention. Ring oscillator 40 is shown as comprising seven digital logic inverters 42(1), 42(2), ..., referred to collectively as inverters 42, which are coupled in series to form an endless loop. The loop must comprise an odd number of inverters 42 in order to function as a ring oscillator, and the quantity seven is probably a practical lower limit.

Power is supplied to inverters 42 from a power source (not shown) which couples +V at input terminal 44. The power source voltage is divided through resistors 46 and 48, and the divided voltage is applied to the supply voltage terminals of inverters 42.

It is well known that the propagation delay time through a digital logic gate is a function of the supply voltage applied to that gate. Generally, the higher the voltage (within acceptable limits for the gate), the faster is the propagation of a signal through the gate. In accordance with one embodiment of the present invention as shown in FIG. 3, resistor 50, switch 52 and frequency control circuit 54 are coupled to the voltage divider comprising resistors 46 and 48 to selectably affect the supply voltage applied to inverters 42. The actuation of switch 52, under the control of circuit 54, into a closed position, causes resistor 50 to be paralleled with resistor 46, thereby increasing the supply voltage to inverters 42. The effect of this change in supply voltage is a reduction in their propagation delays, and a concomitant increase in frequency in ring oscillator 40. In a typical hardware implementation, resistors 46, 48 and 50 may be chosen so that the actuation of switch 52 causes a change of a few tenths of a volt of the supply voltage level applied to inverters 42.

Whereas the FIG. 3 depiction illustrates only a single switchable resistor 50, it is considered within the ability of one skilled in the art to include a plurality of independently controllable switched resistors 50, to thereby provide a corresponding number of different propagation delays through the inverters 42 of ring oscillator 40. Such an implementation would require a corresponding number of independent control signals from frequency control circuit 54 for actuation of the plurality of switches 52.

It is therefore seen that where frequency control circuit 54 actuates switch 52 in a time-varying manner, the frequency of the oscillating output signal from ring oscillator 40 will also vary. It will be understood that the depiction of switch 52 is merely function and that, in an actual hardware implementation, solid state devices such as transistors or integrated circuit transmission gates would preferably be used. In a bulk CMOS LSI implementation of the FIG. 1 generator using the FIG. 3 ring oscillator, it may be more convenient to affect the supply voltage to inverters 42 by selectively raising the reference potential to those elements.

Referring now to FIG. 4, there is shown a ring oscillator 60 according to a second embodiment of the present invention. Ring oscillator 60 is of a type similar to oscillator 40 described in conjunction with FIG. 3. It is well known that the propagation delay time through a digital logic gate is a function of the temperature of that gate. Generally, for the majority of digital logic families, as the temperature of a gate increases, its propagation delay time also increases.

In accordance with the second embodiment of the present invention as shown in FIG. 4, heat sources, shown as resistors 64 and 68, are positioned in close proximity to gates 62(4) and 62(1), respectively, of oscillator 60. The oblique orientation of resistors 64 and 68 as shown in the schematic diagram is intended to represent an oblique physical orientation between the resistors and inverters which tends to increase the gradient effect of the heat transfer. Resistors 64 and 68 are coupled between driver 72 and power supply terminals 66 and 70, respectively. Driver 72 is responsive to input signals received from frequency control circuit 74 to either enable or disable current flow through resistors 64 and 68. When driver 72 enables current flow through resistors 64 and 68, the resistors dissipate heat which elevates the temperatures of the inverters 62(1), 62(4) adjacent the resistors 64, 68, thereby increasing their propagation delay times and decreasing the output signal frequency of ring oscillator 60. Thus, it is seen that where frequency control circuit 74 actuates driver 72 in a time-varying manner, the frequency of the oscillating output signal from ring oscillator 60 will also vary. The embodiment of FIG. 4 lends itself to a single integrated circuit implementation in which resistors 64 and 68 may be imbedded in the substrate in very close proximity to the inverters 62 of oscillator 60.

Referring now to FIG. 5, there is depicted a frequency control circuit 12 of the type which may be implemented as circuit 54 of the FIG. 3 embodiment or as circuit 74 of the FIG. 4 embodiment. The only real requirement on circuit 12 is that it provides a time-varying signal which affects the frequency of ring oscillator 14 (of FIG. 1) in a manner generally unrelated to the output sequence of linear sequence generator 18. As such, control circuit 12 is shown in the present example as a linear sequence generator 82 which is clocked from a submultiple of the frequency of the clocking signal from source 10. Frequency divider 80, which may typically comprise a binary ripple-carry counter, divides the clock frequency from source 10 in accordance with the method used to vary the frequency of ring oscillator 14. Where the temperature altering resistors are used, as in the FIG. 4 embodiment, a lower frequency signal from control circuit 12 would be desirable, such that the sporadic heating and cooling of the resistors will affect the oscillator frequency in a variable manner.

Figure 6:
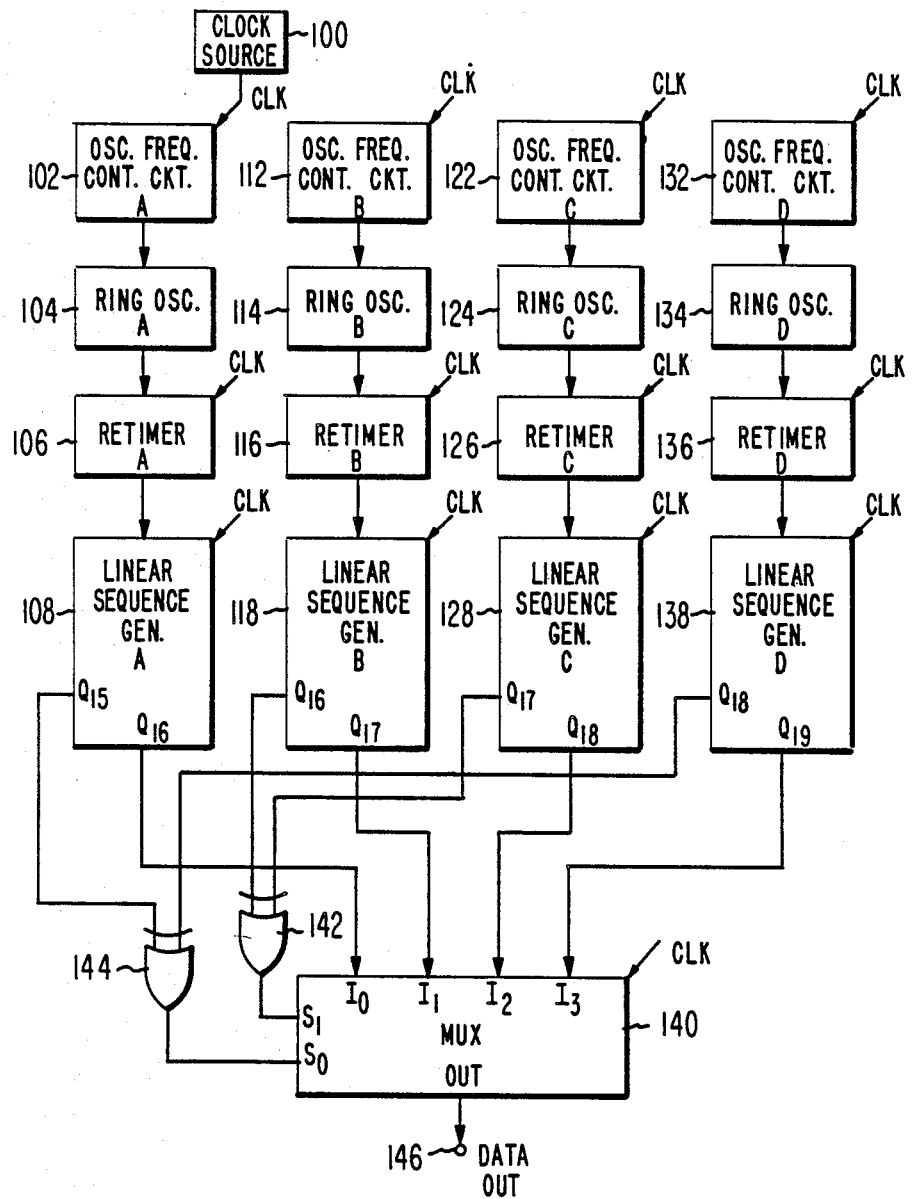
FIG. 6 is a block diagram of a pseudorandom bit stream generator using a plurality of the generators of the FIG. 1 embodiment.

Referring now to FIG. 6, there is shown a system which comprises, in the present example, four of the unpredictable bit stream generators as shown in FIG. 1. The system of FIG. 6 is an enhancement to the effort to provide true randomness in that it introduces more pseudorandom generators into the process, while selecting their outputs in a pseudorandom manner.

The FIG. 6 system includes unpredictable bit stream generator A comprising oscillator frequency control circuit A 102, ring oscillator A 104, retimer A 106 and linear sequence generator A 108. In a like manner, unpredictable bit stream generators B, C and D comprise similar elements. All of the synchronous elements of the system of FIG. 6 are clocked from clock source 100.

Despite their similarities, the four bit stream generators A, B, C and D differ significantly. It will be noted that the four linear sequence generators 108, 118, 128 and 138 are of different lengths (number of stages); this ensures that their sequences and periodicity are different. Further, although not explicitly shown, the four ring oscillators 104, 114, 124 and 134 may have a different number of inverters, thereby oscillating at different frequencies. As an example, oscillator A 104 may have seven inverters, oscillator B 114 may have eleven inverters, oscillator C 124 may have fifteen inverters, and oscillator D 134 may have twenty-five inverters. Finally, although not explicitly shown, it will be recognized that the four linear sequence generators within the four oscillator frequency control circuits 102, 112, 122 and 132 may have different lengths and sequence patterns.

The limiting relationship between the oscillation frequency of the ring oscillator and the clock signal frequency described above in conjunction with the apparatus of FIG. 1, is also relevant to the system of FIG. 6. That is, the oscillation frequencies of each of the oscillators 104, 114, 124 and 134 are all several times greater than the clock signal frequency from source 100.

The outputs signal from the four linear sequence generators 108, 118, 128, 138 are applied to the four input terminals of multiplexer 140, which selects one of the signals at its input terminals to be coupled to its output terminal 146, according to the state of the signals applied to its select ($S_0$, $S_1$) input terminals. In the example shown, the signals from the penultimate stages of linear sequence generators A and D are exclusive-ORed by gate 144 to form the selection signal at $S_0$, and the signals from the penultimate stages of linear sequence generators B and C are exclusive-ORed by gate 142 to form the selection signal at $S_1$. Alternatively, for an odd number of bit stream generators, a majority-rule criterion for selecting the data output at terminal 146 may be implemented in place of gates 142, 144 and multiplexer 140.

While the principles of the present invention have been demonstrated with particular regard to the illustrated structures of the figures, it will be recognized that various departures from such illustrative structures may be undertaken in the practice of the invention. For example, the means for altering the frequency of the ring oscillator need not be limited to the means for varying the power supply level and temperature as depicted in FIGS. 3 and 4. It is considered within the knowledge and ability of one skilled in the art to provide means for varying the load, resistive and/or capacitive, seen at the output of at least one inverter in accordance with some time-varying control circuit. The scope of this invention is therefore not intended to be limited to the structures disclosed herein but should instead be gauged by the breath of the claims which follow.

What is claimed is:

1. An apparatus for generating an unpredictable stream of digital data, said apparatus comprising:
   an oscillator including an odd-numbered plurality of digital logic inverter circuits coupled in series to form an endless ring, each of said inverter circuits having a propagation delay time, said oscillator providing an oscillating digital output signal having frequency determined by the number of inverter circuits and by said propagation delay time of said inverter circuits, said propagation delay times being affected by external influences on said inverter circuits;
   a first sequence generator coupled to said oscillator for generating sequences of digital data, said sequences being corrupted by variations in said frequency of said oscillator output signal; and
   altering means coupled to said oscillator for time-variably altering at least one of said external influences to thereby alter said frequency of said oscillator at times after completion of initial turn-on.

2. The apparatus according to claim 1 wherein said propagation delay times through said inverter circuits are affected by a supply voltage applied to said inverter circuits, said altering means including means for varying said supply voltage applied to said inverters.

3. The apparatus according to claim 2 wherein said altering means further includes a second sequence generator for generating a digital output signal, said second sequence generator being coupled to said supply voltage varying means for selecting between a first and a second magnitude of said supply voltage to be applied to said inverters in accordance with said digital output signal of said second sequence generator.

4. The apparatus according to claim 1 wherein said propagation delay times of said inverter circuits are affected by the temperature of said inverter circuits, and wherein said altering means includes a heater resistor in close proximity to at least one of said inverters, and wherein said altering means further includes a second sequence generator for generating a digital output signal, said second sequence generator being coupled to said heater resistor for enabling current flow through said heater resistor in accordance with said digital output signal of said second sequence generator.

5. The apparatus according to claim 4 wherein said altering means further includes a second resistor coupled to said second sequence generator for enabling current flow through said second resistor, said second resistor being in close proximity to at least one other of said inverters.

6. An apparatus for generating an unpredictable stream of digital data, said apparatus comprising:
an oscillator including an odd-numbered plurality of digital logic inverter circuits coupled in series to form an endless ring, each of said inverter circuits having a propagation delay time, said oscillator providing an oscillating digital output signal having frequency determined by the number of inverter circuits and by said propagation delay times of said inverter circuits, said propagation delay times being affected by external influences on said inverter circuits;
source means for providing a clocking signal;
reclocking means coupled to said oscillator and responsive to said clocking signal for providing samples of said oscillator output signal;
a first sequence generator coupled to said reclocking means for generating sequences of digital data, said sequences being corrupted by variations in said samples of said oscillator output signal; and
altering means coupled to said oscillator for time-variably altering at least one of said external influences for altering the frequency of said oscillator at times after completion of initial turn-on.

7. An apparatus according to claim 6 wherein a supply voltage having a magnitude is supplied to at least one of said inverter circuits, and said propagation delay times of said inverter circuits are affected by said magnitude of said supply voltage applied to said inverter circuits, said altering means including supply voltage varying means for varying said magnitude of said supply voltage applied to said inverters as a function of time.

8. An apparatus according to claim 7 wherein said altering means further includes a second sequence generator for generating a digital output signal, said second sequences generator being coupled to said supply voltage varying means for selecting between a first and a second magnitude of said supply voltage to be applied to said inverters in accordance with said digital output signal of said second sequence generator.

9. An apparatus according to claim 6 wherein said propagation delay times of said inverter circuits are affected by the temperature of said inverter circuits, and said altering means includes a first heater resistor in close proximity to at least one of said inverters, and wherein said altering means further includes a second sequence generator for generating a digital output signal, said second sequence generator being coupled to said first heater resistor for enabling current flow through said first heater resistor in accordance with said digital output signal of said second sequence generator.

10. An apparatus according to claim 9 wherein said altering means further includes a second heater resistor coupled to said second sequence generator for enabling current flow therethrough, said second heater resistor being in close proximity to at least one other of said inverters.

11. An apparatus according to claim 6 wherein said reclocking means includes a D-type flip-flop including clock and data input terminals and responsive at said data input terminal to said oscillator output signal and at said clock input terminal to said clocking signal.

12. An apparatus according to claim 11 wherein the frequency of said oscillator output signal is several times greater than the frequency of said clocking signal.

13. A system for generating an unpredictable stream of digital data, said system comprising:
source means for providing a clocking signal;
a plurality of apparatus for generating an unpredictable stream of digital data bits, each one of said apparatus comprising:
(a) an oscillator including an odd-numbered plurality of digital logic inverter circuits coupled in series to form an endless ring, each of said inverter circuits having a propagation delay time, said oscillator providing an oscillating digital output signal having frequency determined by the number of inverter circuits and by said propagation delay times of said inverter circuits, said propa-gation delay times being affected by external influences on said inverter circuits;
(b) reclocking means coupled to said oscillator and responsive to said clocking signal for providing reclocked samples of said oscillator signal;
(c) a first sequence generator coupled to said reclocking means for generating sequences of digital data, said sequences being corrupted by variations in said reclocked samples of said oscillator signal; and
(d) frequency altering means coupled to said oscillator for time-variably altering the frequency of said oscillator at a time after completion of initial turn-on; and
said system further comprising a single combining means having a plurality of input terminals and an output terminal, said combining means being coupled at said input terminals to said respective plurality of first sequence generators, for providing at said output terminal a stream of digital data which is an unpredictable selection of one of said plurality of sequences of digital data generated by said plurality of first sequence generators.

14. A system according to claim 13 wherein a supply voltage having a magnitude is applied to said inverter circuits for energization, and said propagation delay times of said inverter circuits are affected by said magnitude of said supply voltage applied to said inverter circuits, said frequency altering means including supply voltage varying means for varying said magnitude of said supply voltage applied to said inverters.

15. A system according to claim 14 wherein said frequency altering means further includes further sequence generating means for generating a digital output signal, said further sequence generating means being coupled to said supply voltage varying means for selecting between a first and a second magnitude of said supply voltage to be applied to said inverters in accordance with said digital output signal of said further sequence generating means.

16. A system according to claim 13 wherein said frequency altering means of at least one of said plurality of apparatus further includes a further sequence generating means for generating a digital output signal, said further sequence generating means being coupled to said first heater resistor for enabling current flow through said first heater resistor in accordance with said digital output signal of said further sequence generating means.

17. A system according to claim 16 wherein said frequency altering means of said at least one of said plurality of apparatus further includes a second resistor coupled to said further sequence generating means, said second resistor being in close proximity to at least one other of said inverters.

18. A system according to claim 13 wherein each oscillator of said plurality of apparatus includes a unique number of inverter circuits.

19. A system according to claim 18 wherein said reclocking means of each of said plurality of apparatus includes a D-type flip-flop including data and clock input terminals, and responsive at said data input terminal to said oscillating digital output signal and at said clock input terminal to said clocking signal.

20. A system according to claim 19 wherein said frequencies of said oscillating digital output signals of said oscillators of said plurality of apparatus are all several times greater than the frequency of said clocking signal.

21. A system according to claim 13 wherein said plurality of apparatus for generating an unpredictable stream of digital data bits includes four of said apparatus.

* * * * *